US011510333B2

(12) United States Patent
Norton et al.

(10) Patent No.: US 11,510,333 B2
(45) Date of Patent: Nov. 22, 2022

(54) CABLED MODULE FOR ADDING MEMORY DEVICES TO A SYSTEM

(71) Applicant: Hewlett Packard Enterprise Development LP, Houston, TX (US)

(72) Inventors: John Norton, Houston, TX (US); Vincent Nguyen, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 183 days.

(21) Appl. No.: 16/839,797

(22) Filed: Apr. 3, 2020

(65) Prior Publication Data

US 2021/0315124 A1 Oct. 7, 2021

(51) Int. Cl.
| | |
|---|---|
| H05K 7/14 | (2006.01) |
| H01R 12/75 | (2011.01) |
| H01R 12/73 | (2011.01) |
| H05K 1/18 | (2006.01) |
| H05K 5/00 | (2006.01) |

(52) U.S. Cl.
CPC ......... *H05K 7/1487* (2013.01); *H01R 12/737* (2013.01); *H01R 12/75* (2013.01); *H05K 1/181* (2013.01); *H05K 5/0069* (2013.01); *H05K 7/1489* (2013.01); *H05K 2201/10159* (2013.01); *H05K 2201/10189* (2013.01)

(58) Field of Classification Search
CPC .... H05K 7/1487; H05K 1/181; H05K 5/0069; H05K 7/1489; H05K 2201/10159; H05K 2201/10189; H05K 3/366; H05K 1/141
See application file for complete search history.

(56) References Cited

U.S. PATENT DOCUMENTS

| | | | | |
|---|---|---|---|---|
| 6,856,508 | B2* | 2/2005 | Rabinovitz | .......... G11B 33/128 |
| 7,200,023 | B2* | 4/2007 | Foster, Sr. | ............... G11C 5/04 |
| | | | | 365/189.05 |
| 7,298,625 | B1 | 11/2007 | Wu et al. | |
| 7,574,542 | B2* | 8/2009 | Burroughs | .............. G06F 1/206 |
| | | | | 710/316 |
| 7,621,460 | B2* | 11/2009 | Dorr | ....................... G06F 1/206 |
| | | | | 318/472 |
| 8,230,145 | B2* | 7/2012 | Bresniker | ........... G06F 13/1694 |
| | | | | 370/395.5 |
| 8,755,192 | B1* | 6/2014 | Schrempp | .......... H05K 7/20736 |
| | | | | 361/752 |
| 8,972,620 | B2* | 3/2015 | Billick | .................. G08B 21/00 |
| | | | | 711/E12.078 |
| 9,134,770 | B2* | 9/2015 | Liu | ......................... G06F 1/185 |

(Continued)

OTHER PUBLICATIONS

Lim, K. et al., "Disaggregated Memory for Expansion and Sharing in Blade Servers," Jun. 20-24, 2009, pp. 267-278.

(Continued)

*Primary Examiner* — Rockshana D Chowdhury
*Assistant Examiner* — Douglas R Burtner
(74) *Attorney, Agent, or Firm* — Hewlett Packard Enterprise Patent Department

(57) ABSTRACT

A module, comprising: a printed circuit board (PCB); a power and management connector disposed on the PCB to connect to a computing device via a first cable; a data connector disposed on the PCB to connect to the computing device via a second cable; and a memory slot, to accept a memory device, disposed on the PCB and connected to the power and management connector and the data connector.

19 Claims, 13 Drawing Sheets

(56) References Cited

U.S. PATENT DOCUMENTS

| | | | | |
|---|---|---|---|---|
| 9,229,504 B1* | 1/2016 | Marr | | G06F 1/263 |
| 10,101,542 B2* | 10/2018 | Kostecka | | G02B 6/4441 |
| 10,849,223 B2* | 11/2020 | Thakar | | H05K 7/20727 |
| 10,956,353 B1* | 3/2021 | Bailey | | G06F 13/4068 |
| 11,004,476 B2* | 5/2021 | Leung | | G11C 5/04 |
| 11,061,454 B2* | 7/2021 | Chiang | | H02J 9/061 |
| 11,251,576 B2* | 2/2022 | Blevins | | H05K 1/141 |
| 11,266,007 B2* | 3/2022 | Devalla | | H05K 1/141 |
| RE49,124 E* | 7/2022 | Arnouse | | G06F 11/2023 |
| 2003/0033544 A1* | 2/2003 | King | | G06F 1/187 |
| | | | | 726/4 |
| 2013/0088843 A1* | 4/2013 | Cong | | G06F 1/185 |
| | | | | 361/785 |
| 2013/0107444 A1* | 5/2013 | Schnell | | G06F 1/189 |
| | | | | 361/679.33 |
| 2014/0077591 A1* | 3/2014 | Saitou | | H05K 5/0069 |
| | | | | 307/9.1 |
| 2014/0233192 A1* | 8/2014 | Hsu | | G06F 1/185 |
| | | | | 361/737 |
| 2015/0062797 A1* | 3/2015 | Yin | | G06F 1/185 |
| | | | | 361/679.32 |
| 2015/0342071 A1* | 11/2015 | Mijac | | H05K 5/0056 |
| | | | | 361/752 |
| 2016/0143179 A1* | 5/2016 | Shocket | | H05K 1/181 |
| | | | | 361/719 |
| 2017/0127549 A1* | 5/2017 | Lunsman | | H05K 7/1487 |
| 2019/0029132 A1* | 1/2019 | Haba | | H05K 5/0065 |
| 2019/0182955 A1* | 6/2019 | Murtagian | | G06F 1/185 |
| 2019/0279597 A1* | 9/2019 | Park | | H05K 5/0017 |
| 2020/0097214 A1* | 3/2020 | Zheng | | G06F 13/4022 |
| 2020/0214164 A1* | 7/2020 | Doll | | H05K 7/1489 |

OTHER PUBLICATIONS

Newegg Inc., "AddOn—Memory Upgrades CBL-QSFP-40GE-PASS-0.5M-AO Direct Attach Cables," Retrieved May 13, 2019, 2 Pgs.

* cited by examiner

CABLED MODULE FOR ADDING MEMORY DEVICES TO A SYSTEM

BACKGROUND

Increasing bandwidth demands for memory may not be supported based on current configurations and architectures. Adding more single ended Double Data Rate (DDR) memory devices is costly, takes up valuable motherboard real estate, or there is not enough space on the motherboard for extra memory devices. Current motherboard designs exacerbate this issue. Further, peripheral memory device additions are not common, are expensive, and inefficient.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

DETAILED DESCRIPTION

Figure 1:
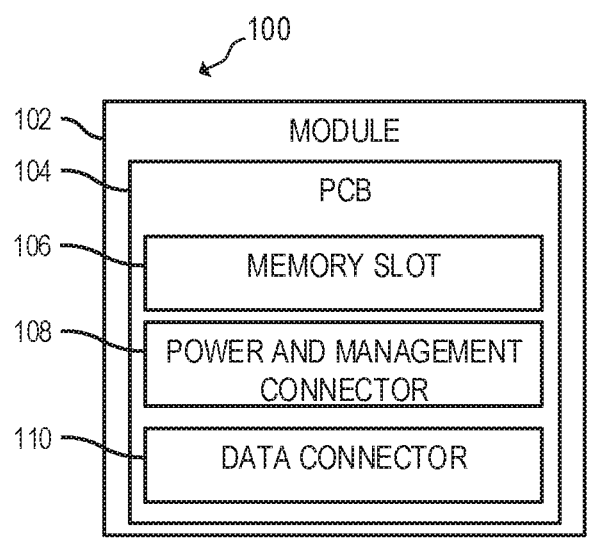
FIG. 1 is a block diagram of a module, according to an example.

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Increasing bandwidth demands for memory may not be supported based on current configurations and architectures. Adding more single ended Double Data Rate (DDR) memory devices is costly, takes up valuable motherboard real estate, or there is not enough space on the motherboard for extra memory devices. Current motherboard designs exacerbate this issue. Further, peripheral memory device additions are not common, are expensive, and inefficient.

Based on new memory architectures, improvements upon existing memory devices, and/or the separation of power and management cables/signals from data cables/signals (stated another way, high speed memory cables/signals), attached memory devices are achievable. In other words, more memory devices may be added to a computing device without increasing the amount of memory connectors located on a computing devices motherboard. Thus, more memory devices may be added to a system via cables, for example, as peripheral devices.

Based on the issues and solutions described above, a module to attach via cable to a computing device may be utilized. In such examples, the module may include a printed circuit board (PCB). A power and management connector may be disposed on the PCB. Further, the power and management connector may electrically connect to a memory slot and physically/mechanically connect to the PCB (for example, as a surface-mount technology (SMT) connection, through-hole, or by some other method). The power and management connector may include a slot to accept a cable. The cable may connect the power and management connector to a computing device (for example, to a motherboard of a computing device). The module may also include a data connector disposed on the PCB. The data connector may electrically connect to the memory slot and physically/mechanically connect to the PCB (for example, as a SMT connection, through-hole, or by some other method). The data connector may include a slot to allow for a cable. The cable may connect the data connector to a computing device (for example, to a motherboard of a computing device). As noted, the module may include a memory slot. The memory slot may accept a memory device. The memory slot may be disposed on the PCB. In other words, the memory slot may physically/mechanically connect to the PCB (for example, as a surface-mount technology (SMT) connection, through-hole, or by some other method). In another example, the memory slot may accept a differential dual in-line memory module (DDIMM) or a dual in-line memory module (DIMM). In another example, the memory slot may electrically connect to the power and management connector and the data connector (for example, through traces on the PCB).

Examples described herein, include a module. The module may comprise a printed circuit board (PCB). The module may also comprise a power and management connector disposed on the PCB. The power and management connector may connect to a computing device via a first cable. The module may also comprise a data connector disposed on the PCB. The data connector may connect to the computing device via a second cable. The module may also comprise a memory slot. The memory slot may accept a memory device. The memory slot may be disposed on the PCB and may be connected to the power and management connector and the data connector.

FIG. 1 is a block diagram 100 of a module 102, according to an example. In an example, the module 102 may include a PCB 104. The PCB 104 may include several components.

For example, a data connector 110, power and management connector 108, a memory slot 106, or some combination thereof may be disposed on the PCB 104. The components may be electrically and physically/mechanically connected to the PCB 104. In another example, the power and management connector 108 may accept a first cable. The first cable may connect to a computing device or the motherboard of a computing device. In another example, the data connector 110 may accept a second cable. The second cable may connect to a computing device or the motherboard of a computing device. In another example, the memory slot 106 may connect electrically connect to the power and management connector 108 and the data connector 110. In another example, the memory slot 106 may accept a memory device. Further, the memory device may connect to the computing device via the first and second cables connecting the power and management connector 108 and data connector 110 to the computing device.

As used herein, a "computing device" may be a storage array, storage device, storage enclosure, server, desktop or laptop computer, networking device, switch, access point, or any other device or equipment including a controller, a processing resource, or the like. In examples described herein, a "processing resource" may include, for example, one processor or multiple processors included in a single computing device or distributed across multiple computing devices. As used herein, a "processor" or "processing resource" may be at least one of a central processing unit (CPU), a semiconductor-based microprocessor, a graphics processing unit (GPU), a field-programmable gate array (FPGA) to retrieve and execute instructions, other electronic circuitry suitable for the retrieval and execution instructions stored on a machine-readable storage medium, or a combination thereof.

As used herein, a "memory device" may be any electronic, magnetic, optical, or other physical storage apparatus to contain or store information such as executable instructions, data, and the like. For example, any machine-readable storage medium described herein may be any of Random Access Memory (RAM), volatile memory, non-volatile memory, flash memory, a storage drive (e.g., a hard drive), a solid state drive, any type of storage disc (e.g., a compact disc, a DVD, etc.), and the like, or a combination thereof. Any machine-readable storage medium described herein may be non-transitory. As used herein, a "differential dual in-line memory module" or "DDIMM" is a memory module utilizing a differential memory architecture. In other words, two wires are for each bit, as in one wire sends a "1" and the other sends a "0".

As used herein, "hot plug" may refer to the act of adding a component or components to a system while the system is powered on and/or running. Further, hot plug may include the continued operation of the system without significant interruption when the component or components are added. In other words, a device may be added to a system while the system is operating and the user or the system itself may perform an administrative task, so that the added device can be utilized. Hot plug may also be referred to with terms such as, hot pluggable, hot plugging, or hot pluggability. For example, a device may be noted to be "hot pluggable".

As used herein, "hot swap" may refer to the act of replacing, removing, or adding a component or components while the system is powered on and/or running. Further, hot swap may include the continued operation of the system without interruption. In other words, in response to a hot swap operation (for example, replacing one device with a new device), a system may operate as normal without interruption. Hot swap may also be referred to with terms such as, hot swappable, hot swapping, or hot swappability. In other words, a device may be noted to be "hot swappable".

As used herein, "rack unit" or "U" may refer to the unit of measurement to define the height of a rack frame and the height of the equipment in a rack frame (such as, computing devices). Each rack unit may be equivalent to 44.50 millimeters or 1.75 inches. For example, a computing device, such as a rack server, may have a height of 2 U or 2 rack units (in other words, 89 millimeters or 3.5 inches).

As used herein, a "blade enclosure" or "blade chassis" may refer to an enclosure or chassis which may accept various computing devices. For example, a blade enclosure may be a metal chassis with a midplane disposed in, approximately, the middle of the blade enclosure. The midplane may include various connections and traces. In such examples, the blade enclosure may accept computing systems (such as, blade servers or half-height blade servers), storage sub-chassis', and/or management modules in the front. The blade enclosure may accept power supplies, cooling devices (such as fans or liquid cooling interfaces), switches, interconnects, management modules, and/or other computing devices. A blade enclosure may be equivalent to 10 U. As used herein, a "blade server" may refer to a computing device of a different height, depth, and width than that of a standard rack server. The blade server, as described above, may rack or be inserted into the front of a blade enclosure. The blade server may offer the same functionality as a rack server, but in a smaller form factor.

As used herein, a "controller" may be any microcontroller, BMC, circuit, CPU, microprocessor, GPU, FPGA, chassis manager, rack level manager, other electronic circuitry suitable to communicate with the dock or faceplate and the computing device. For example, the controller may be a BMC of a server.

As used herein, a "Baseboard Management Controller" is a specialized service processor that monitors the physical state of a server or other hardware using sensors and communicates with a management system through an independent "out-of-band" connection. The BMC may also communicate with applications executing at the OS level through an input/output controller (IOCTL) interface driver, a Representational state transfer (REST) application program interface (API), or some other system software proxy that facilitates communication between the BMC and applications. The BMC may have hardware level access to hardware devices located in a server chassis. The BMC may be able to directly modify the hardware devices. The BMC may operate independently of the OS of the system that the BMC is located in. The BMC may be located on the motherboard or main circuit board of the server or other device to be monitored. The fact that a BMC is mounted on a motherboard of the managed server or otherwise connected or attached to the managed server does not prevent the BMC from being considered "separate". As used herein, a BMC has management capabilities for sub-systems of a computing device and is separate from a processing resource that executes an OS of a computing device. The BMC is separate from a processor, such as a central processing unit, executing a high-level OS or hypervisor on a system.

As used herein, "inter-integrated circuit bus" or "I2C bus" is a type of bus used for attaching peripheral integrated circuits to processors and/or controllers in short distance communication. An I2C bus may be utilized for power and management signals. As used herein, "System Management Bus" or "SMBus" is a subset of I2C and may be utilized for management signals.

As noted above, FIG. 1 is a block diagram 100 of a module 102, according to an example. In an example, the module 102 may include more than one memory slot 106. For example, the module 102 may include two memory slots 106. In another example, the memory slot 106 or slots may accept DIMMs (for example, double data rate 5 (DDR5) DIMMs or double data rate 4 (DDR4) DIMMs). In another example, the memory slot 106 or slots may accept DDIMMs. In another example, the memory slot 106 may accept other types of dynamic random access memory (DRAM), other volatile memory, or non-volatile memory.

In another example, the module 102 may include a PCB 104. In such examples, the PCB 104 may include apertures. Further, the apertures may allow the module to connect to a sled, chassis, sub-chassis, or some other similar enclosure to retain one or more modules 102. In another example, the PCB 104 may include a fastener, latch, or some other mechanism to attach to a corresponding latch, fastener, or other mechanism on a sled, chassis, sub-chassis or some other similar enclosure to retain one or more modules 102.

As noted above, the module 102 may include a power and management connector 108. In such examples, the power and management connector 108 may be connected to the memory slot 106. The power and management connector 108 may provide power to the memory slot 106 or memory slots. Further, management signals may be sent to and from the power and management connector 108 to the memory slot 106. The power and management connector 108 may connect, via a cable, to a computing device or port or connector on a motherboard. In such examples, the port or connector on the motherboard may connect to a power source or supply on the motherboard. Further, the port or connector on the motherboard may connect to a controller. In such examples, the controller may be a BMC.

As noted, the power and management connector 108 may connect to, via cable, a controller (for example, a BMC and/or system firmware on a component of the computing device) on the motherboard of a computing device. In an example, the power and management connector 108, via the cable, may send sideband management signals to a controller on the motherboard of a computing device. In such examples, the sideband management signals may include memory device topologies of the module 100, thermal data, errors, events, logs, component failure information, other configuration data, and/or diagnostic data. In such examples, logs may be stored on the module 100 (for example, on a memory device or some other integrated circuit included on the module 100). In such examples, the sideband management signals may be generated by a memory device inserted into the memory slot 106. In another example, the sideband management signals may be generated by an integrated circuit connected between the memory slot 106 and the power and management connector 108.

As noted above, the module 102 may include a data connector 110. In an example, the data connector 110 may connect to the memory slot 106. In such examples, the memory slot 106 may accept memory devices. In such examples, the memory devices may store and send data. The memory device may send data to and receive data from a processing resource (for example, a processing resource included on a motherboard of a computing device). In such examples, the data signals may be sent via the data connector 110 and a cable connecting the data connector 110 to a processing resource (via traces on a motherboard). In another example, the data signals may be sent via the data connector 110 and a cable connecting the data connector 110 to a controller, memory controller, Gen Z protocol controller, or some other type of coherency controller. The controller may be included on a motherboard of a computing device. The controller may be connected to a processing resource.

In another example, the module 102 may be hot swappable or hot pluggable. For example, a user may add a module 102 to a computing device, sled, chassis, sub-chassis, or enclosure while the computing device is powered on.

In another example, the module 102 may include a power and management slot. In such examples, the power and management slot may accept a power and management connector of another module. In such examples, modules 102 may be stacked one on top of the other. In such examples, the data connector 110 may connect to a motherboard via a cable, such as a ribbon cable. In such examples, the power and management connector 108 of the bottom most module in such a stack may direct connect to a power and management slot on a motherboard or connect via cable to the motherboard. In another example, each module 102 may indicate which number it is in the stack (in other words, the modules 102 location). Further, each module 102 may indicate the amount of memory slots 106 included on the module 102 and which memory slots 106 are populated. In such examples, each module 102 may include circuitry, such as slot allocation and population circuitry, to provide such signals described above.

In an example, a module 100 may be connected to a computing device. In another example, the module 100 may also be added to a sled, chassis, sub-chassis, or enclosure. Since the power and management connector 108 and data connector 110 separate power and management signals from data signals (for example, high speed memory signals), cables may be used to connect the module 100 (either directly or via a sled, chassis, sub-chassis, or enclosure). Based on the separation of power and management signals and data signals, the data signals may maintain signal integrity. Further, data signal integrity may be maintained over the length of a cable. Thus, cables may be utilized to connect the module 100 to a computing device, rather than directly adding more memory slots to an already space constrained motherboard (which can be costly and inefficient).

Figure 2:
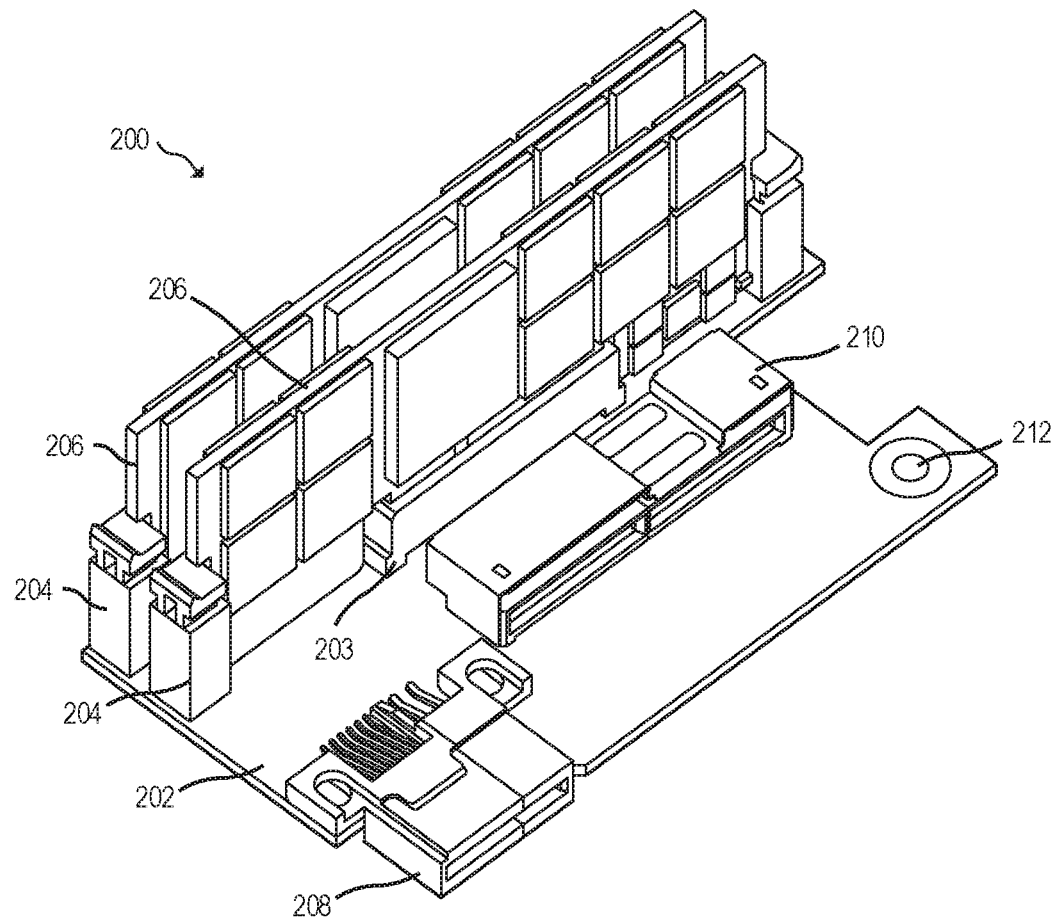
FIG. 2 is a schematic view of a module, according to an example.

FIG. 2 is a schematic view of a module 200, according to an example. In such examples, the module 200 may include a PCB 202. The PCB 202 may include several components. In an example, one component may be a memory slot 203. In an example, the PCB 202 may include multiple memory slots 203. For example, FIG. 2 shows two memory slots 203, although more may be included. In another example, the memory slot 203 may accept a memory device 206. In another example the memory device 206 may be a DIMM, DDIMM, a non-volatile memory device, or volatile memory device. In another example, the memory slot 203 may electrically connect to a power and management connector 208 and data connector 210 included on the PCB 202. In such examples, the memory slot 203 may connect to the power and management connector 208 and data connector 210 via traces (not shown) on the PCB 202.

In another example, latches 204 may be disposed on the PCB 202. Each of the latches 204 may correspond to a memory slot 203. Further, each memory device 206 may include a notch or other feature corresponding to the latches 204. In such examples, when a memory device 206 is inserted into the memory slot 203, the latches 204 may fasten or lock into the notch or other corresponding feature and retain the memory device 206.

As noted above, one component included on the PCB 202 may be a power and management connector 208. As noted, the power and management connector 208 may electrically connect to the memory slot 203. The power and management connector 208 may connect to power and management pins included on the memory slot 203. Thus, power and management signals from the memory slot 203 may be able to connect to a port or connector on a motherboard via the power and management connector 208. In such examples, the power and management connector 208 may provide power, from the motherboard, to the memory slot 203. In another example, the power and management connector 208 may send management commands from and/or to the port or connector on the motherboard or components on the motherboard. In an example, the power and management connector may be surface mounted to the PCB 202 or connected through hole.

In another example, other components may be included between the power and management connector 208 and the memory slot 203, such as back-up power sources and/or slot allocation and population circuitry. In such examples, a back-up power source may be included on the PCB. In such examples, if power failure occurs, the back-up power source may provide power to the memory slot 203 for an amount of time sufficient for the memory device 206 to send data to a non-volatile memory device. In such examples, the back-up power source may be a battery or capacitor. In another example, the slot allocation and population circuitry may provide, through management signals, how many memory slots 203 are disposed on the PCB 202, how many memory slots 203 are populated with memory devices 206, and/or where the module 200 is positioned in a sled, chassis, sub-chassis, or enclosure.

As noted above, one component included on the PCB 202 may be a data connector 210. As noted, the data connector 210 may electrically connect to the memory slot 203. In such examples, data signals may be sent through the data connector 210 to and from the memory slot 203. For example, data to be stored in the memory device 206 may be sent from a motherboard or component on a motherboard to the memory device 206 plugged into the memory slot 203.

In another example, the PCB may include an aperture 212. In such examples, a fastener, for example a screw or latch, may attach the module 200 to a sled, chassis, sub-chassis, or other enclosure. In such examples, the fastener may pass through the aperture 212 and attach to a corresponding attachment feature on the sled, chassis, sub-chassis, or other enclosure.

Figure 3A:
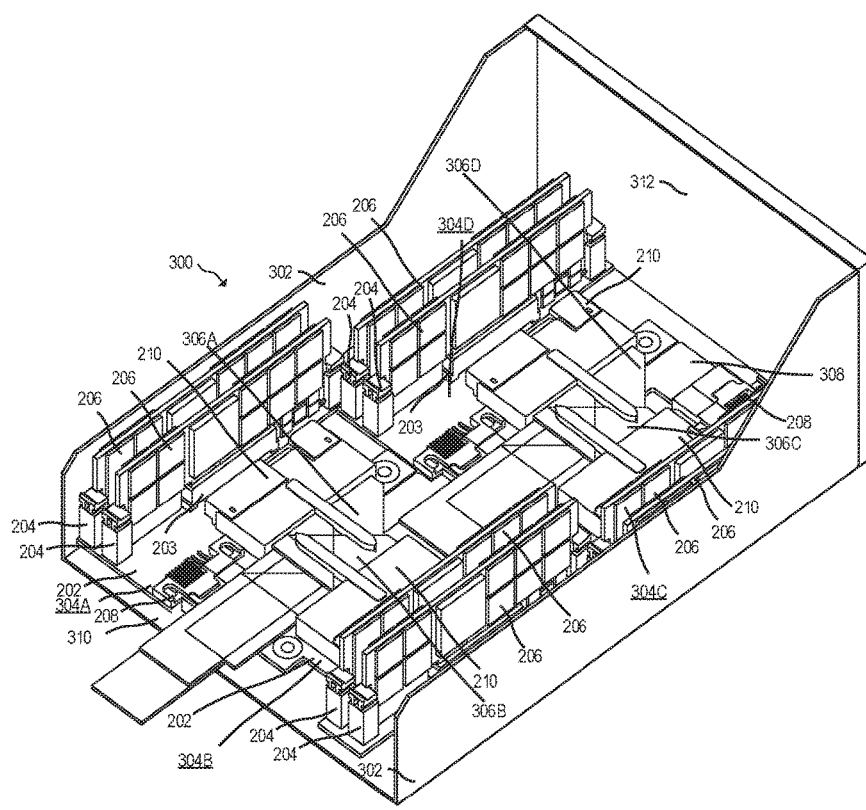
FIG. 3A is a schematic of a sled including a plurality of modules, according to an example.

FIG. 3A is a schematic of a sled 300 including a plurality of modules 304, according to an example. In such an example, the sled 300 may include a plurality of modules 304. In another example, the sled 300 may include four modules 304A, 304B, 304C, and 304D. In such examples, each module 304 may attach to the bottom or flat portion 310 of the sled 300. Side walls 302 may enclose the modules 304. A front wall 312 may enclose one end of the sled 300. In such examples, the front wall 312 may include many apertures (not shown). The many apertures may allow for air to flow through the sled 300 to cool each module 304.

In an example, each module 304 may include a corresponding data connector 210. The data connectors 210 may accept corresponding cables 306. Each cable 306 may connect a module 304 to a computing device, motherboard, processing resource, server, or the like. For example, module 304A may connect to a connector on a server motherboard via cable 306A, module 304B may connect via 306B, module 304C may connect via 306C, and module 304D may connect via 306D.

In another example, a power and management cable may connect to the power and management connectors 208. In another example, a power and management PCB 308 may connect each of the power and management connectors 208 of each module. A cable (not shown) may connect the power and management PCB 308 to a connector located on a computing device, motherboard, processing resource, server, or the like.

Figure 3B:
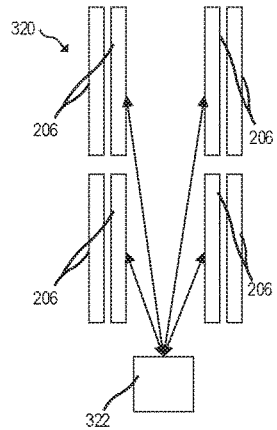
FIG. 3B is a block diagram of a topology representing the sled including the plurality of modules, according to an example.

FIG. 3B is a block diagram of a topology 320 representing the sled 300 including the plurality of modules 304, according to an example. In such examples, each memory device 206 on each module may connect, via cable through the data connector, to a processing resource 322. In another example, the memory devices 206 may connect to more than one processing resource 322. In another example, the memory devices 206 may connect to a controller included on a computing device, motherboard, server, or the like. In such examples, the controller may connect to various processing resources. Further, each processing resource may utilize the memory devices included on each module. In such examples, the controller may be a memory controller, Gen Z protocol controller, or some other type of coherency controller.

Figure 4:
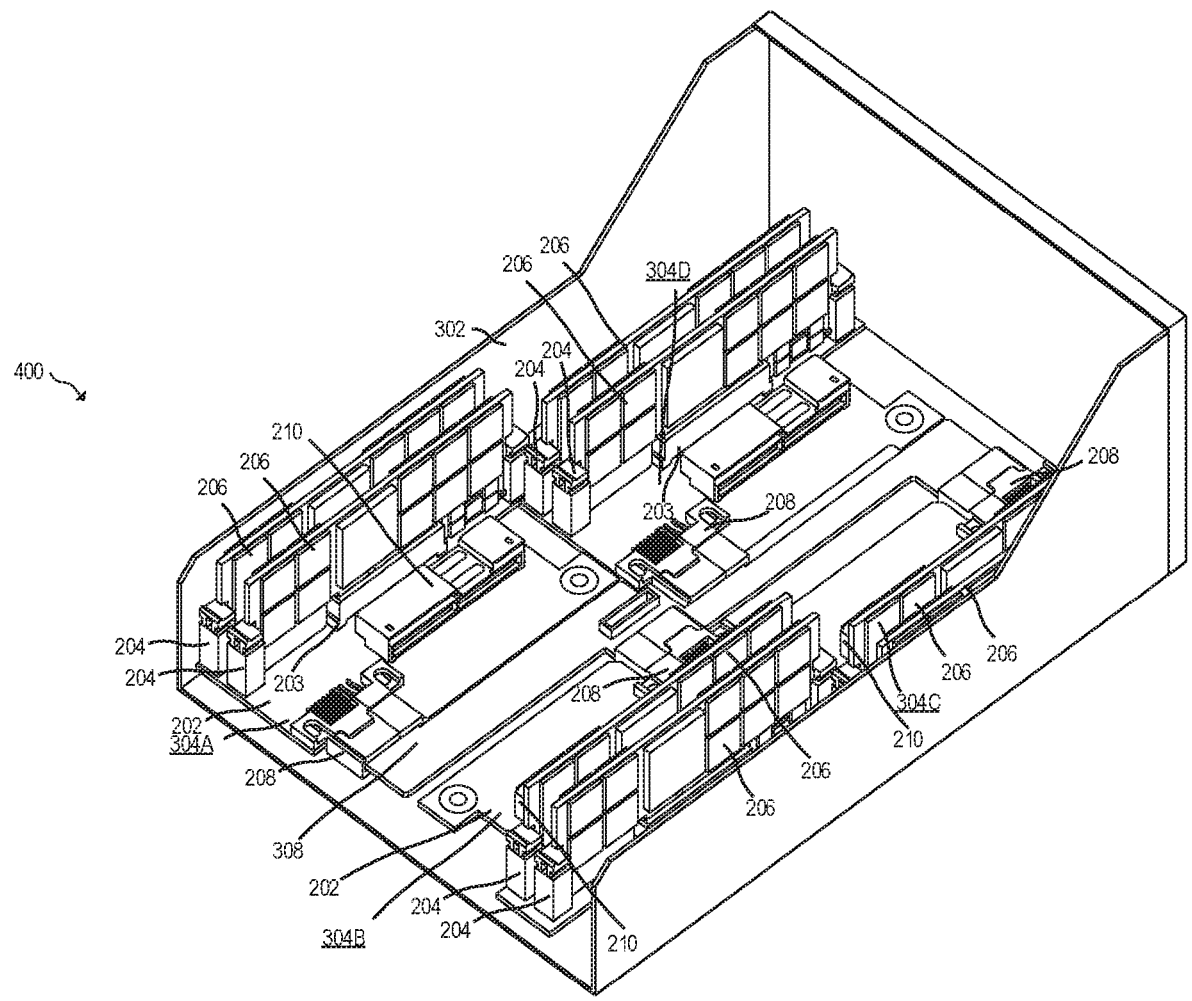
FIG. 4 is another schematic view of a sled including a plurality of modules, according to an example.

FIG. 4 is another schematic view of a sled 400 including a plurality of modules 304, according to an example. In such examples, the data cables are removed to show a power and management PCB 308. In such examples, the power and management PCB 308 may connect each power and management connector 208. A cable (not shown) may attach the power and management PCB 308 to a power and management connector located on a computing device, motherboard, server, or the like. In another example, the power and management PCB 308 may include a port to accept a cable (for example, a ribbon cable).

In another example, the power and management PCB 308 may include an I2C or SMBus interface. In such examples, each module 304 may include slot allocation and population circuitry. The slot allocation and population circuitry may drive management signals (for example, through the I2C or SMBus interface) indicating the location of the module 304 in the sled 300, the amount of memory slots 203 included on the module 304, and/or the amount of memory slots 203 populated by memory devices 206. In such examples, the information generated by the slot allocation and population circuitry may be sent to a controller or a BMC on the computing device, motherboard, processing resource, server, or the like.

Figures 5A, 5B:
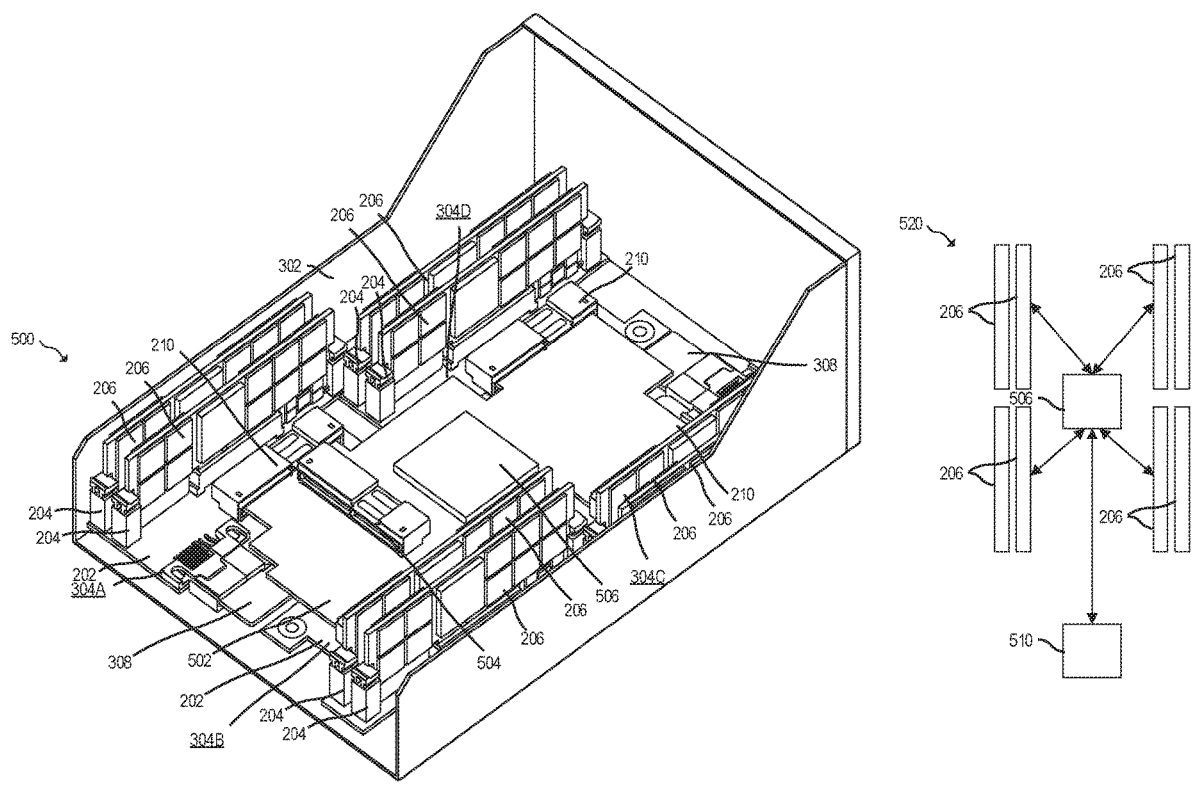
FIG. 5A is a schematic view of a sled including a plurality of modules and an application specific integrated circuit (ASIC), according to an example.
FIG. 5B is a block diagram of a topology representing the sled including the plurality of modules and ASIC, according to an example.

FIG. 5A is a schematic view of a sled 500 including a plurality of modules 304 and an application specific integrated circuit (ASIC) 506, according to an example. In such examples, each module 304 may directly connect, via data connector 210, to a data PCB 502, rather than connecting directly to a computing device. In an example, the data PCB 502 may include an ASIC 506 (for example, a switch or controller). The ASIC 506 may allow for one cable to connect the sled, through data connector 504, to a computing device or a motherboard on a computing device. For example, a sled may include four x16 lane cables connecting each module, via the data connector, to a motherboard or computing device (see FIG. 3A). With a data PCB 502, each data connector 210 may directly connect to the data PCB 502. In such examples, one cable may run from the data connector 504 on the data PCB 502 to a computing device or a motherboard on a computing device. In another example, the ASIC 506 may include other functionality, including, but not limited to, memory coherency, memory management, and/or memory allocation. In another example, the ASIC 506 may be a switch, controller, memory controller, Gen Z protocol controller, or some other type of coherency controller.

In another example, the data PCB 502 may connect to the power and management PCB 308. In such an example, the data PCB 502 may send data signals to a motherboard of a computing device via a cable connected to data connector 504. Further, the data PCB 502 may include a connector for power and management signals (not shown). The connector for power and management signals may send the power and management signals to the motherboard of the computing device via another cable. In another example, one cable, running from data connector 504, may send data signals and power and management signals to the motherboard of the computing device.

FIG. 5B is a block diagram of a topology 520 representing the sled 500 including the plurality of modules and an ASIC 506, according to an example. In such an example, each memory device 206 of a module may connect to the ASIC 506. Further, the ASIC 506 may connect to a computing device or a motherboard of a computing device. Further, the ASIC 506 may connect, through a cable, with a processing resource 510.

Figure 6:
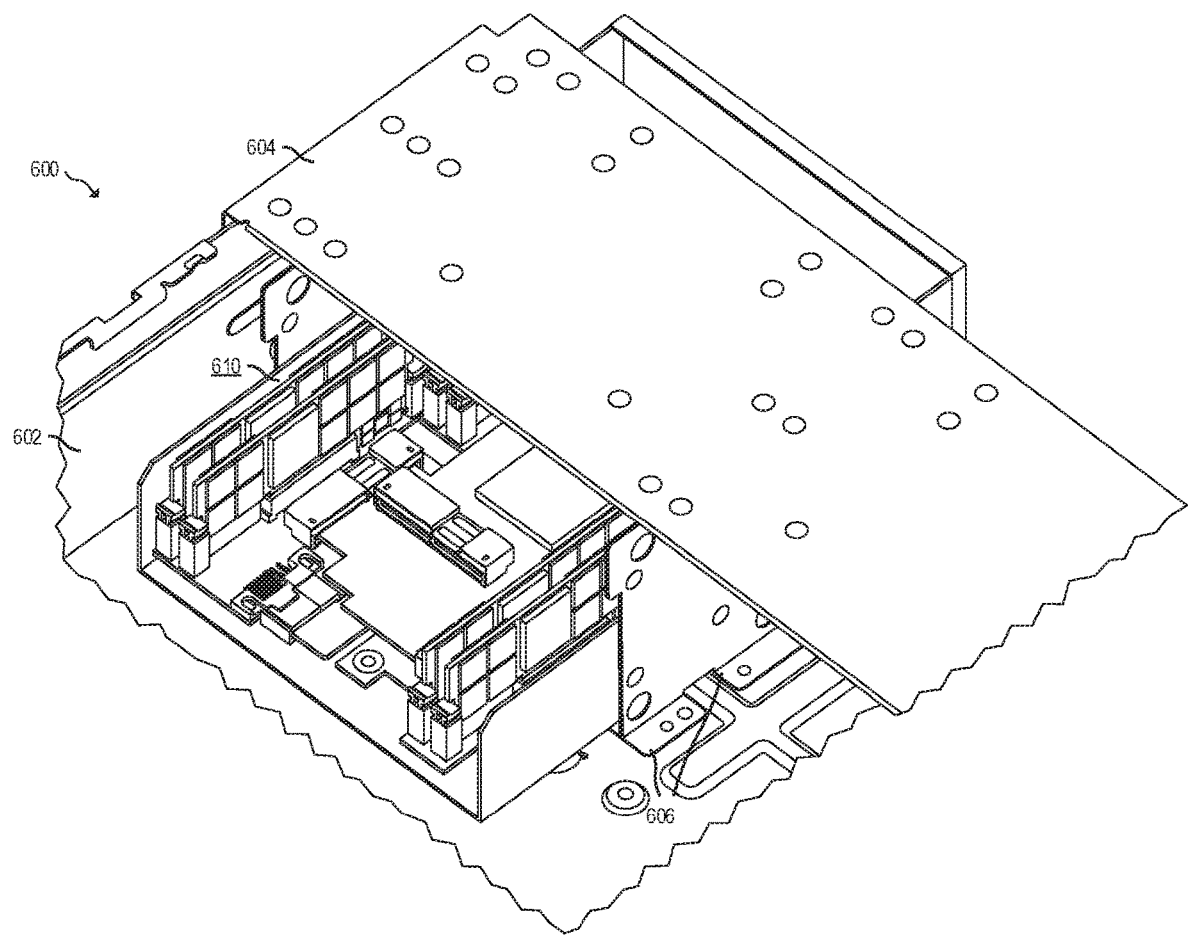
FIG. 6 is a schematic view of a sled inserted into a computing system, according to an example.

FIG. 6 is a schematic view of a sled 610 inserted into a computing device 600, according to an example. In an example, a sled 610 may be inserted into a computing device 600. After insertion into a computing device 600 the sled 610 may be connected to a motherboard or some other resource module of the computing device 600. Stated another way, when a sled 610 is inserted into a computing device 600, a user may connect cables from the sled 610 to ports or connections on the motherboard of the computing device 600. In another example, the sled 610 may latch onto the chassis 602 of the computing device 600 when the sled 610 is fully inserted into the computing device 600. In another example, when the sled 610 is fully inserted into the computing device 600, the sled may be fixed to the chassis 602, via fasteners (for example, screws). In such examples, the sled 610 may include apertures to allow the fasteners (e.g., screws) to pass through to attach to corresponding attachment features on the chassis 602. In another example, a structure 606 may be attached to the chassis 602. The structure 606 may include toolless features to allow for insertion and retention of the sled 610. In a further example, the structure 606 may be fixedly or removably attached to the chassis 602. For example, the structure 606 may be staked to the chassis 602 or may be attached to the chassis 602 via screws. In another example, the sled 610 may be inserted into the front or rear of a computing device 600. In another example, the sled may fit into a 1 U computing device, 2 U computing device, larger computing device (for example, a 4 U server), a blade server, and/or a blade chassis.

Figure 7:
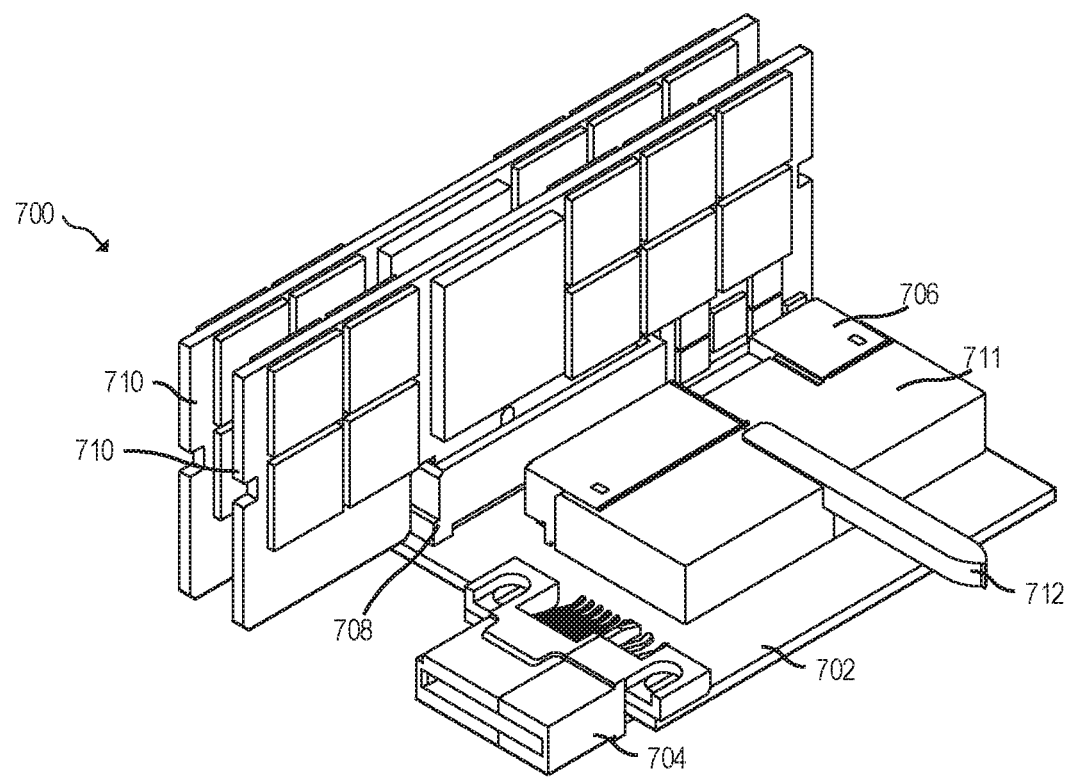
FIG. 7 is a schematic view of a module, according to an example.

FIG. 7 is a schematic view of a module 700, according to an example. As noted above, a module 700 may include a memory slot 708, a power and management connector 704, and a data connector 706. In an example, the PCB 702 of the module 700 may be substantially smaller. In another example, the PCB 702 may not include latches (as shown in FIG. 2, e.g., latches) for the memory devices 710. In such examples, the force exerted on a memory device 710 by the memory slot 708 may retain the memory device 710. In another example, latches may connect to the memory device 710 and attach directly to a sled, chassis, sub-chassis, or enclosure. As noted above, a cable (the connecting portion 711 shown) may connect to the data connector 706. The connecting portion 711 of the cable may include a pull 712. The pull 712 may allow for easy removal/addition of the cable.

Figure 8:
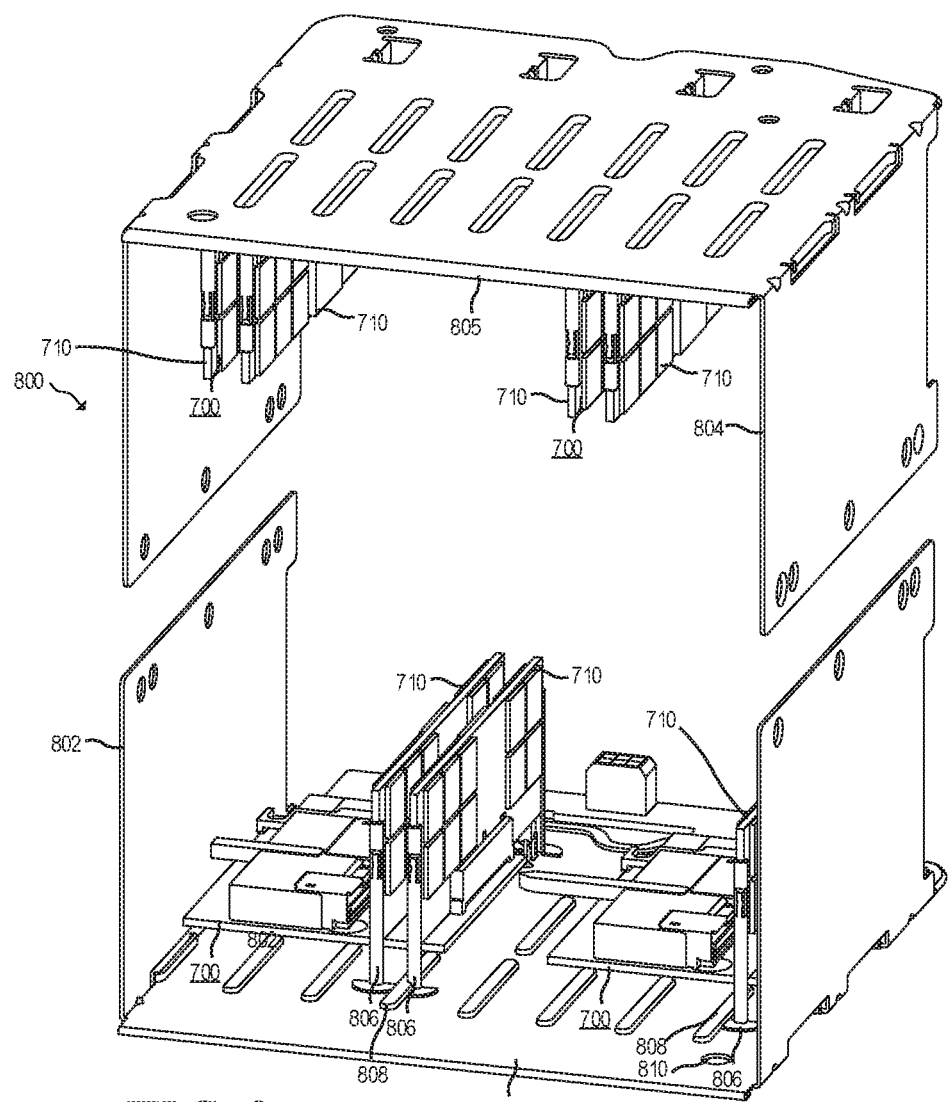
FIG. 8 is a schematic view of a chassis including a plurality of modules, according to an example.

FIG. 8 is a schematic view of a chassis 800 including a plurality of modules 700, according to an example. In such an example, the modules 700 (for example, the module 700 from FIG. 7) may be attached to the chassis 800 or sub-chassis. In such examples, modules 700 may connect to a bottom clamshell 802 and top clamshell 804 of the chassis 800 or sub-chassis. In another example, more than one module 700 may connect to the bottom clamshell 802 and top clamshell 804 each. In an example, in a populated chassis 800 or sub-chassis, the memory devices 710 of modules 700 on the bottom clamshell 802 may offset the memory devices 710 of modules 700 on the top clamshell 804.

As noted, the memory devices 710 included in the module 700 may include or accept latches 806. In such examples, the bottom portion 803 of the bottom clamshell 802 and the top portion 805 of the top clamshell 804 may include ridges 808. Further, the latches 806 on the memory device 710 may connect to or latch onto the ridges 808. In another example, the bottom portion 803 of the bottom clamshell 802 and top portion 805 of the top clamshell 804 may include another feature to accept the latches 806 of the memory devices 710, such as apertures or some other feature corresponding to the latches 806.

In another example, the bottom clamshell 802 and top clamshell 804 may connect to each other to form a chassis 800 or sub-chassis. In an example, the bottom clamshell 802 and top clamshell 804 may connect to each other toollessly. In another example, when the bottom clamshell 802 and top clamshell 840 connect, a user may affix them to each other with fasteners, such as screws.

Figure 9:
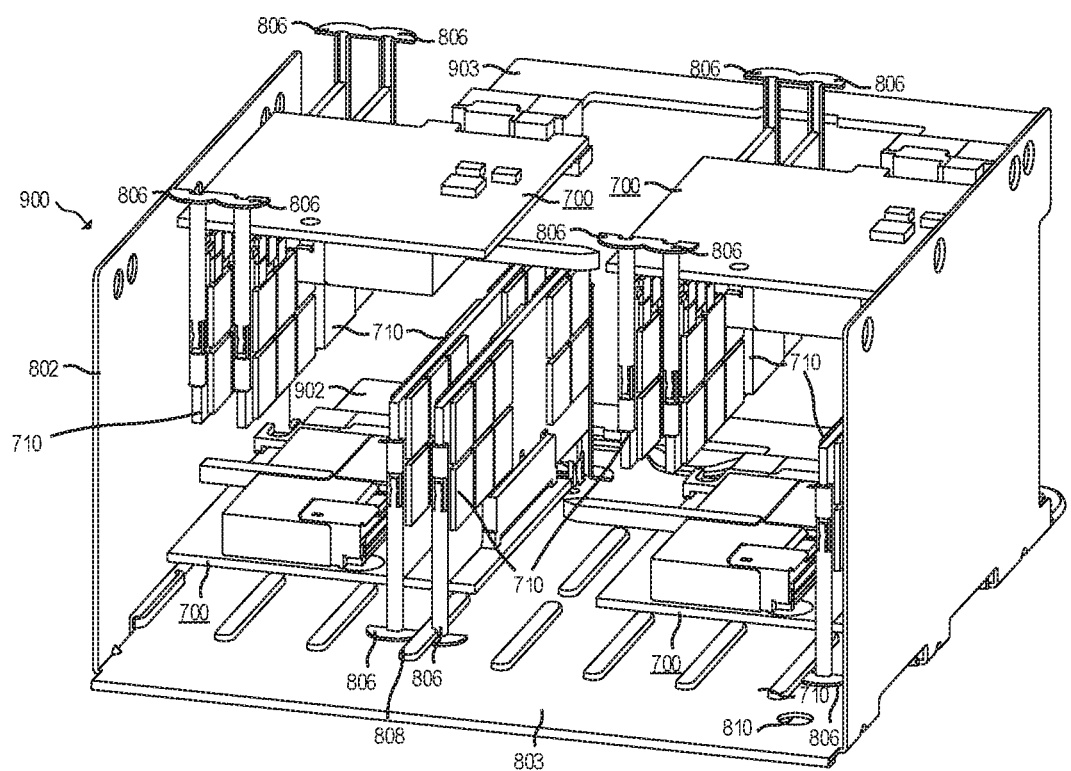
FIG. 9 is another schematic view of the chassis including a plurality of modules, according to an example.

FIG. 9 is another schematic view of the chassis 900 including a plurality of modules 700, according to an example. As noted above, in a populated chassis 900, the memory devices 710 of modules 700 on the bottom clamshell 802 may offset the memory devices 710 of modules on the top clamshell (not shown). In another example, a power and management PCB 902 may connect the modules 700 included on the bottom clamshell 802. In another example, another power and management PCB 903 may connect the modules 700 included on the top clamshell (not shown). In such examples, the power and management PCB 902, 903 may include a connector to accept a cable. The cable may connect to a computing device or motherboard of a computing device. The cable may transfer power and management signals to and from each of the modules 700.

Figure 10:
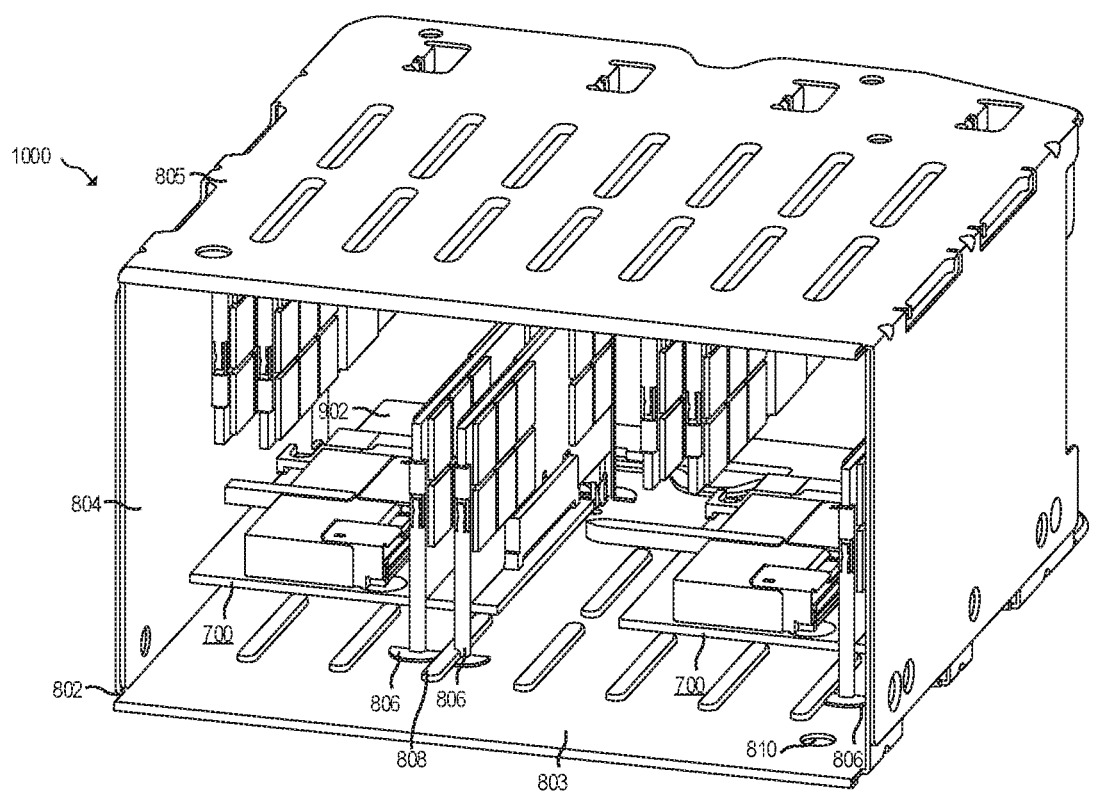
FIG. 10 is another schematic view of the chassis including a plurality of modules, according to an example.

FIG. 10 is another schematic view of the chassis 1000 including a plurality of modules 700, according to an example. As noted, the bottom clamshell 802 may attach to the top clamshell 804. In such examples, the bottom clamshell 802 may toollessly attach to the top clamshell 804. In another example, and as noted above, the bottom clamshell 802 may attach to the top clamshell 804 via fasteners (e.g., screws or latches).

Figure 11:
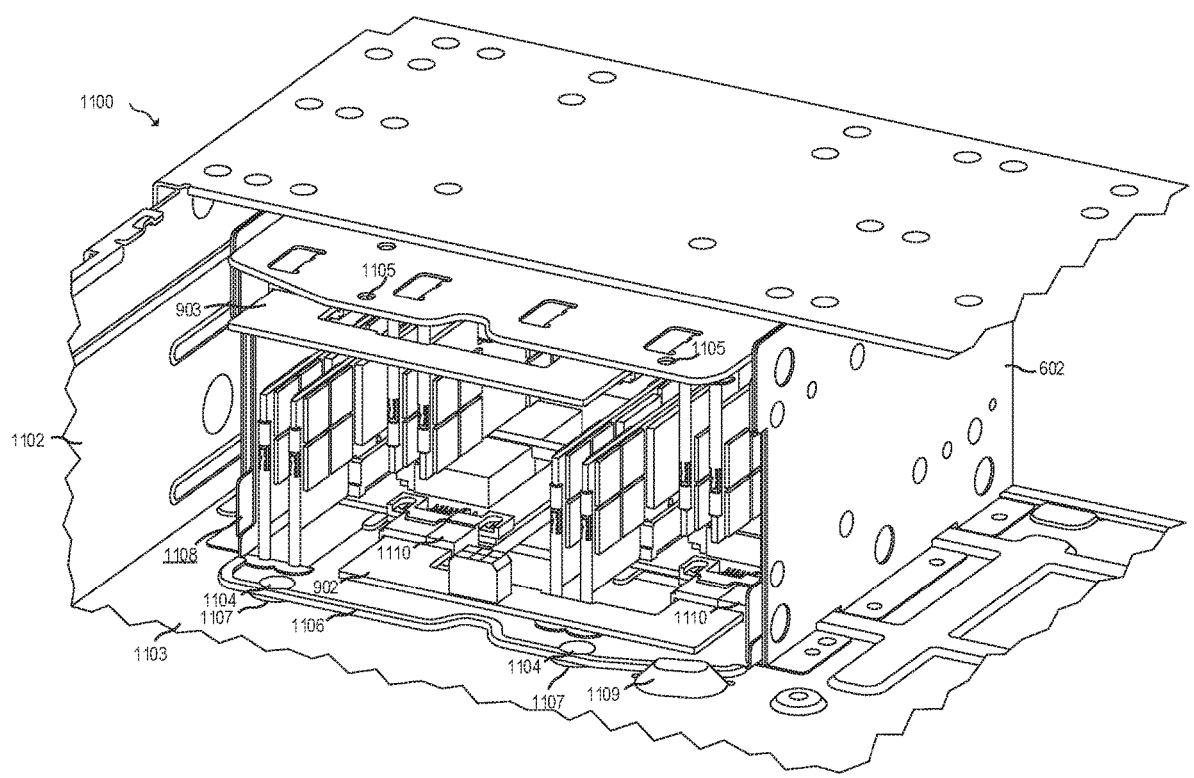
FIG. 11 is another schematic view of the chassis including a plurality of modules, according to an example.

FIG. 11 is another schematic view of the chassis 1108 including a plurality of modules, according to an example. In an example, the chassis 1108 may be inserted into a computing device 1102. The chassis 1108, when fully inserted into the computing device 1102, may toollessly attach to the computing device 1102. In another example, a user may fasten the chassis 1108 to the computing devices 1102 chassis 1103 via fasteners 1104 (e.g., screws) through apertures 1105 on the chassis 1108 to corresponding attachment features 1107 on the computing devices 1102 chassis 1103 (e.g., threaded apertures). In another example, a stop 1109 may be included on the computing devices 1102 chassis 1103 to prevent over insertion of the chassis 1108. In another example, the chassis 1108 may fit into a 1 U, 2 U, or larger computing device. In another example, the chassis 1108 may be invertible or reversible. In other words, the apertures 1105 may be located on the top and bottom of the chassis 1108. In an example, the chassis 1108 may be inserted into the rear or front of a computing device 1102. In another example, the chassis 1108 may fit into a 1 U computing device, 2 U computing device, larger computing device (for example, a 4 U server), a blade server, and/or a blade chassis.

Figure 12:
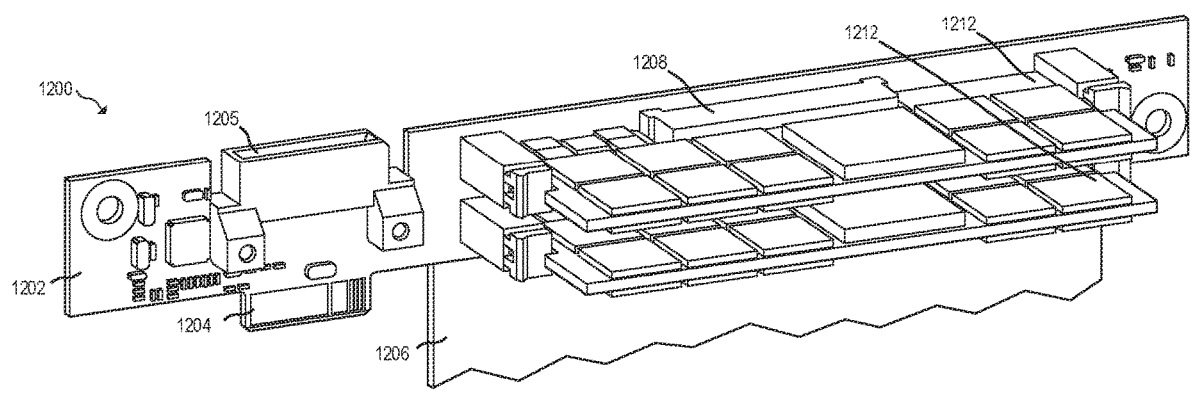
FIG. 12 is a schematic view of a module, according to an example.

FIG. 12 is a schematic view of a module 1200, according to an example. In an example, the module 1200 may include a memory slot 1208, a power and management connector 1204, a power and management slot 1205, and a data cable 1206 or data connector (not shown). In an example, the power and management slot 1205 may accept the power and management connector of another module. In another example, the data cable 1206 may be directly attached to the module 1200. In another example, the module 1200 may include a data connector. In such examples, the data connector may be located on the back of the module 1200. In such examples, the data cable 1206 may connect to a motherboard of a computing device.

In another example, the module 1200 may include an integrated circuit to generate management data. The integrated circuit may be a slot allocation and population circuit. Further, slot allocation and population circuit may generate data such as, how many memory slots 1208 are disposed on the PCB 1202, how many memory slots 1208 are populated with memory devices 1212, and/or where the module 1200 is positioned in a sled, chassis, sub-chassis, or enclosure (in relation to other modules stacked on top of or below module 1200).

Figure 13:
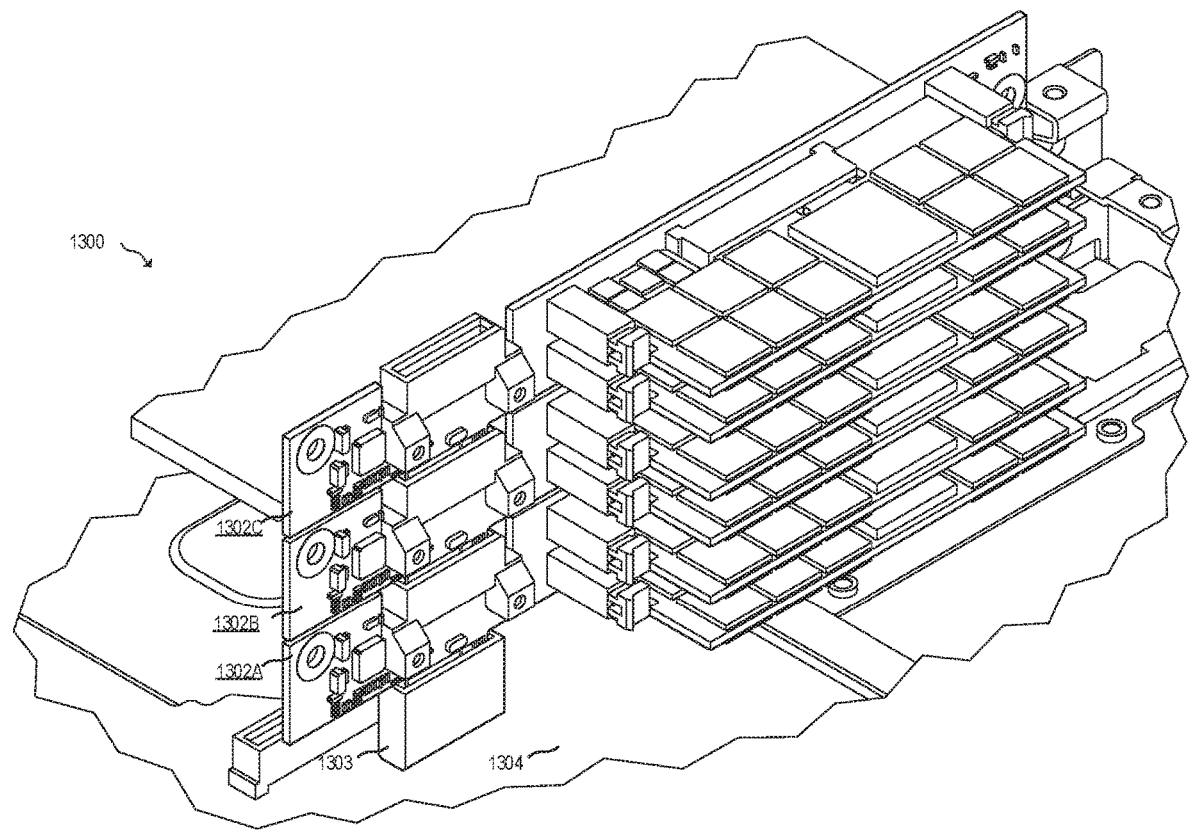
FIG. 13 is a schematic view of a plurality of modules, according to an example.

FIG. 13 is a schematic view of a plurality of modules 1302, according to an example. In an example, a motherboard 1304 may include a power and management slot 1303. The first modules 1302A power and management connector may connect to the power and management slot 1303 of the motherboard 1304 of the computing device. Further, another modules 1302B power and management connector may insert into the power and management slot of module 1302A. Still further, modules 1302C power and management connector may insert into the power and management slot of module 1302B. In such an example, more modules may be stacked one on top of the other. The number of modules may be constrained by the size of the computing device that the modules are added to. In another example, the cables may run behind the modules 1302. In another example, the data cables may attach to a slot or connector on the motherboard of the computing device.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be examples. Structure and acts described herein are replaceable by equivalents, which perform the same function, even if the structure or acts are different, as known in the art. Therefore, the scope of the present disclosure is limited only by the elements and limitations as used in the claims

What is claimed is:

1. A system comprising a plurality of modules inserted into a sled,
    wherein the sled includes a power and management PCB to connect to power and management connectors of the plurality of modules and allow connection to a computing device via a first cable, and
    wherein each respective module comprises:
        a respective printed circuit board (PCB);
        a respective power and management connector disposed on the PCB to connect to the power and management PCB;
        a respective data connector disposed on the PCB to connect to the computing device via a second cable; and
        a respective memory slot, to accept a memory device, disposed on the PCB and connected to the power and management connector and the data connector.

2. The system of claim 1, wherein each respective module includes a plurality of memory slots.

3. The system of claim 1, wherein the respective memory slot is a differential dual in-line memory module (DDIMM).

4. The system of claim 1, wherein the respective PCB includes apertures to allow for physical connection to a chassis or the sled.

5. The system of claim 1, wherein each respective module further comprises a power and management slot disposed on the respective PCB.

6. The system of claim 5, wherein the power and management slot accepts a power and management connector of another module.

7. The system of claim 6, wherein the power and management slot indicates a position of a respective module.

8. The system of claim 1, wherein the each respective module is hot swappable.

9. The system of claim 1, wherein the each respective module is hot pluggable.

10. The system of claim 1, wherein the sled comprises:
    a base;
    physical connections, disposed on a top of the base, to allow for the plurality of modules to be attached to a top side of the base of the sled; and
    connectors on a bottom side of the base to attach to the computing device.

11. The system of claim 10, wherein the sled accepts the plurality of modules in a configuration in which memory devices of a first module are aligned on a different plane than memory devices of a second module, wherein the first module and the second module are adjacent and on a same side of the sled.

12. The system of claim 10, wherein the sled includes a data PCB to connect to data connectors of the plurality of modules and allow connection to the computing device via a third cable, wherein the data PCB includes at least one of a switch, a controller, a memory controller, and a coherency controller.

13. The system of claim 10, wherein the plurality of modules directly attach to the computing device via a fourth cable.

14. The system of claim 1, wherein the respective module further comprises circuitry between the respective power and management connector and the respective memory slot, wherein the circuitry generates management signals to be sent to the computing device.

15. The system of claim 14, wherein the management signals comprise:
- a location of the respective module as its position in the sled with other modules of the plurality of modules;
- a first number of a plurality of memory slots disposed on the PCB; and
- a second number of the first number of the memory slots which are populated with a corresponding memory device.

16. The system of claim 14, wherein the power and management PCB includes an interface, wherein the circuitry of the respective module drives the management signals, via the interface, to a controller or a BMC on the computing device.

17. The system of claim 16, wherein the interface comprises at least one of an Inter-Integrated Circuit (I2C) interface and a System Management Bus (SMBus) interface.

18. The system of claim 1, wherein the respective module further comprises a back-up power source between the respective power and management connector and the respective memory slot.

19. The system of claim 18, wherein the back-up power source is to provide power to the respective memory slot in the event of a power failure for an amount of time sufficient for the memory device inserted in the respective memory slot to send data to a non-volatile memory device.

* * * * *